(12) United States Patent
Otani et al.

(10) Patent No.: US 6,407,686 B1
(45) Date of Patent: Jun. 18, 2002

(54) WAVEFORM MEASURING APPARATUS

(75) Inventors: Akihito Otani; Toshinobu Otsubo; Hiroto Watanabe, all of Atsugi (JP)

(73) Assignee: Anritsu Corporation, Tokyo (JP)

( * ) Notice: Subject to any disclaimer, the term of this patent is extended or adjusted under 35 U.S.C. 154(b) by 0 days.

(21) Appl. No.: 09/941,145

(22) Filed: Aug. 28, 2001

(30) Foreign Application Priority Data

Aug. 31, 2000 (JP) ....................................... 2000-263592

(51) Int. Cl.[7] ................................................. H03M 1/10
(52) U.S. Cl. ...................... 341/120; 341/118; 341/115; 341/155; 324/76.15
(58) Field of Search ................................. 341/118, 120, 341/115, 155; 324/76.15, 158.1, 758, 601

(56) References Cited

U.S. PATENT DOCUMENTS

| | | | | |
|---|---|---|---|---|
| 4,142,146 A | * | 2/1979 | Schumann et al. | 324/76.15 |
| 4,647,907 A | * | 3/1987 | Storey | 341/118 |
| 5,138,267 A | * | 8/1992 | Komagata et al. | 324/601 |
| 5,530,373 A | * | 6/1996 | Gibson et al. | 324/758 |
| 6,339,388 B1 | * | 1/2002 | Matsumoto | 341/120 |

* cited by examiner

*Primary Examiner*—Michael Tokar
*Assistant Examiner*—Lam T. Mai
(74) *Attorney, Agent, or Firm*—Frishauf, Holtz, Goodman & Chick, P.C.

(57) ABSTRACT

A reference signal generation portion generates a reference signal independently of a repetition cycle of a signal under test. A frequency measuring portion measures a repetition frequency of the signal under test by using a reference signal from the reference signal generation portion. A sampling frequency setting portion computes and sets a value of frequency of a sampling signal which can obtain a desired delay time with respect to a phase of the signal under test based on a value of a repetition frequency measured with the frequency measuring portion. The sampling signal generation portion uses a reference signal from the reference signal generation portion and the value of the frequency set by the sampling frequency setting portion to generate a sampling signal having a cycle corresponding to the frequency.

6 Claims, 4 Drawing Sheets

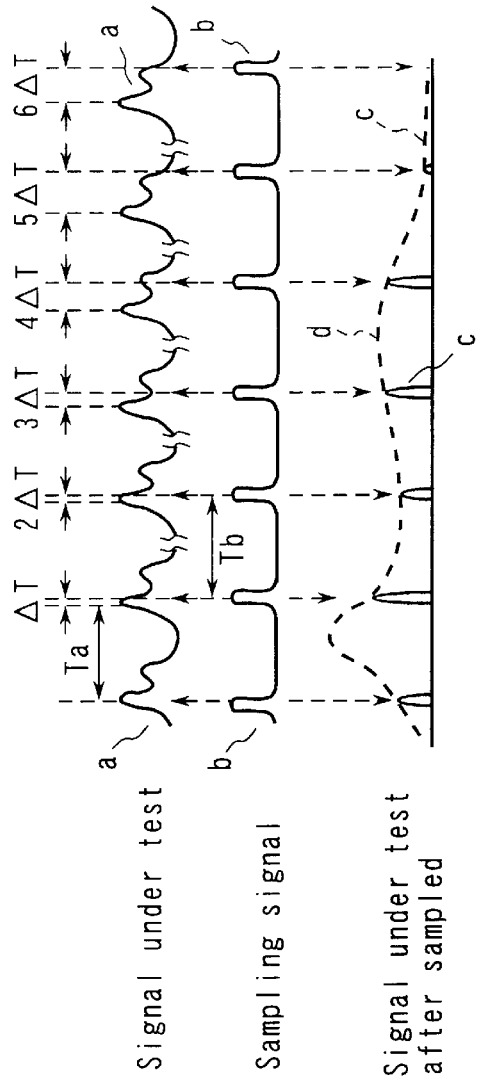
FIG. 6A (PRIOR ART) Signal under test
FIG. 6B (PRIOR ART) Sampling signal
FIG. 6C (PRIOR ART) Signal under test after sampled
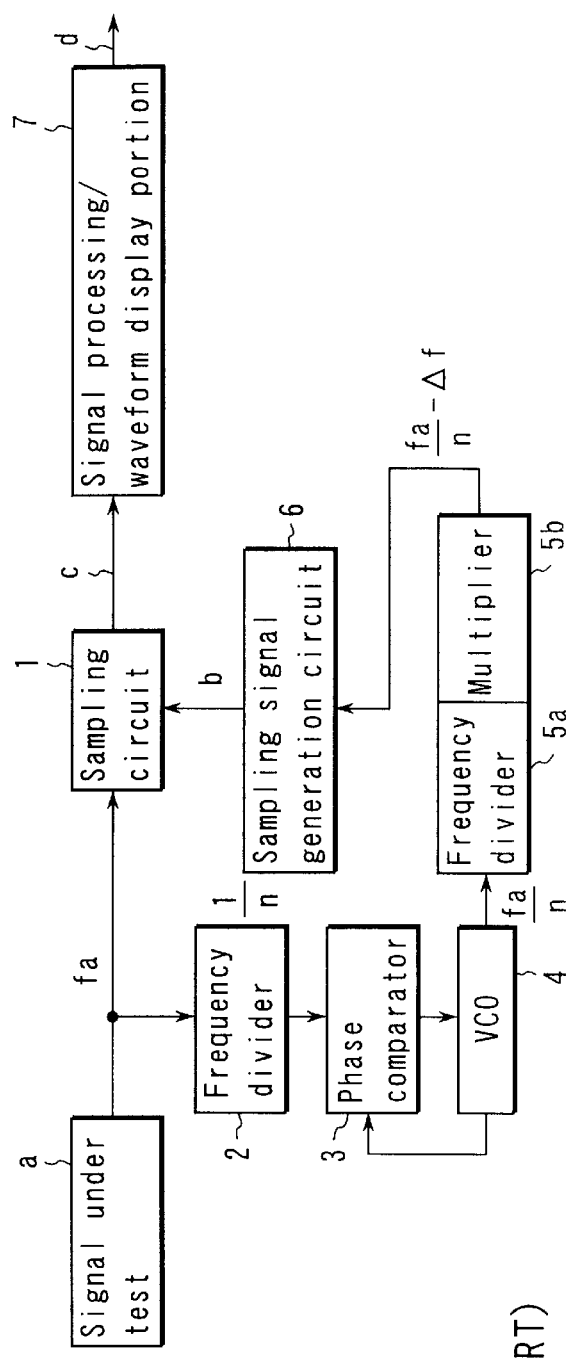
FIG. 7 (PRIOR ART)

WAVEFORM MEASURING APPARATUS

CROSS-REFERENCE TO RELATED APPLICATIONS

This application is based upon and claims the benefit of priority from the prior Japanese Patent Application No. 2000-263592, filed Aug. 31, 2000, the entire contents of which are incorporated herein by reference.

BACKGROUND OF THE INVENTION

1. Field of the Invention

The present invention relates to a waveform measuring apparatus, in particular, to a waveform measuring apparatus for determining a signal waveform of a signal under test having an arbitrary repetition cycle which is input.

2. Description of the Related Art

Generally, a signal generator for generating a signal under test such as an electric signal, an optical signal or the like having an arbitrary repetition cycle incorporates a reference signal oscillator for generating a reference signal having a reference frequency fs, and a waveform pattern generation portion for generating a waveform pattern of the signal under test.

Then, in such signal generator, a repetition frequency signal having a designated repetition frequency fa is created by using a reference signal output from the reference signal oscillator while an electric signal and an optical signal are created which have an arbitrary repetition cycle Ta by using this repetition frequency signal and the waveform pattern output from the waveform pattern generation portion.

The electric signal and the optical signal having a repetition cycle Ta output from such signal generator are generally incorporated in an information communication system and are used as a signal under test of various communication devices including, for example, optical transmission cable.

Therefore, it is necessary to measure in detail the characteristic of the electric signal and the optical signal output from the signal generator prior to the practice of the test of various communication devices including the light transmission cable incorporated in the information communication system.

As one characteristic of this electric signal and the optical signal, the signal waveform is measured.

Conventionally, there are proposed various measuring methods for measuring a signal waveform of the signal under test that is an electric signal, an optical signal or the like having such an arbitrary repetition cycle.

However, in the case of a high frequency signal having a repetition cycle Ta, namely, a repetition frequency fa exceeding 10 GHz, the method for measuring the waveform of the signal under test is used a sampling method.

A representative sampling method for measuring a signal waveform of the signal under test which has this repetition frequency fa exceeding 10 GHz will be explained by using FIGS. 6A, 6B and 6C.

As shown in FIGS. 6A and 6B, the signal under test "a" which has this repetition cycle Ta (for example, a repetition frequency fa=10 GHz) is sampled with a sampling signal b having a frequency Tb (for example, repetition frequency fb=999,9 MHz) longer than a repetition cycle Ta of this signal under test "a".

In this case, it is so constituted that as shown in FIGS. 6A and 6B, the sampling position of the sampling signal b to the signal waveform having the repetition cycle Ta of this signal under test "a" is shifted by a small time $\Delta T$ with the passage of time by adjusting a relationship between repetition cycles Ta and Tb with the result that the sampling position is delayed as seen in $\Delta T, 2\Delta T, 3\Delta T, 4\Delta T, 5\Delta T, 6\Delta T \ldots$ Consequently, the signal under test c after being sampled with this sampling signal b comes to have a discrete waveform in which a pulse-like waveform appears at a position synchronous with the sampling signal b as shown in FIG. 6C.

Then, the envelope waveform of each pulse-like waveform becomes a signal waveform d which is expanded in a direction of time axis of the signal under test "a".

A waveform measuring apparatus for measuring the signal waveform d of the signal under test "a" in the principle of sampling technique shown in FIGS. 6A, 6B, 6C is constituted, for example, as shown in FIG. 7.

The signal under test "a" which has a repetition frequency fa (repetition cycle Ta) is input to a sampling cycle 1 and a frequency divider 2.

The frequency divider 2 sends an output signal obtained by dividing the repetition frequency fa of the signal under test "a" to 1/n to the phase comparator 3.

The voltage control oscillator (VCO) 4 functions as a phase locked loop (PLL) which generates a signal having a frequency (fa/n) having a frequency of 1/n (n: positive integer) of the repetition frequency to feed back the signal to the phase comparator 3.

The phase comparator 3 which constitutes a phase locked loop (PLL) together with the voltage control oscillator (VCO) 4 detects a phase difference between the phase of the output signal of the voltage control oscillator (VCO) 4 and a phase of the output signal of the frequency divider 2 and sends the phase difference to the voltage control oscillator (VCO) 4 as a phase difference signal.

With this phase locked loop (PLL), the phase of the output signal from the voltage control oscillator (VCO) 4 is synchronized with the phase of the signal under test "a".

The frequency (fa/n) of the output signal having a frequency (fa/n) output from the voltage control oscillator (VCO) 4 is converted into a frequency of (fa/n) $-\Delta f$ by a fixed dividing rate of frequency divider 5a and a fixed multiplying rate of frequency multiplier 5b to be input to the sampling signal generation circuit 6.

Here, the sampling signal generation circuit 6 applies a sampling signal b having a repetition frequency (fb) as shown in an equation (1) which is synchronized with the output signal which is input and a repetition cycle (Tb) as shown in the equation (2) to the sampling circuit 1.

$$fb=(fa/n)-\Delta f \quad (1)$$

$$Tb=(nTa)+\Delta T \quad (2)$$

However, the relationship between $\Delta f$ and $\Delta T$ can be approximately shown in the equation (3).

$$\Delta f/\Delta T=fa^2/n^2 \quad (3)$$

Then, the sampling circuit 1 sends a signal under test c which is sampled by sampling the signal under test "a" which has been input in synchronization with the sampling signal b input from the sampling signal generation circuit 6 to the next signal processing/waveform display portion 7.

This signal processing/waveform display portion 7 calculates an envelope waveform of the signal under test c after being sampled while converting a magnification of the time axis of this envelope waveform into the magnification of the original signal under test "a" to be displayed and output as a signal waveform d of the original signal under test "a".

In this case, the expansion ratio of the envelope waveform measured with respect to the signal waveform d of the signal under test "a" is (fa/nΔf).

Incidentally, in the case where the signal under test "a" is not an electric signal but is an optical signal, this optical signal is converted into an electric signal to be applied to the frequency divider 2.

Furthermore, in the case where the signal under test "a" is not an electric signal but is an optical signal, for example, an electro-absorption modulator is used instead of the sampling circuit 1.

This electro-absorption modulator is capable of sampling a pulse-like signal under test "a" that is an input optical signal by applying a pulse-like electric field that is a sampling signal to the electro-absorption modulator.

Then, the signal under test c that is an optical signal which is sampled is sent to the signal processing/waveform display portion 7 after being converted into an electric signal.

However, the following problems to be settled are provided even in a conventional waveform measuring apparatus using a sampling technique shown in FIG. 7.

That is, an output signal from the fixed multiplying rate of frequency multiplier 5b for creating a sampling signal b having a repetition signal fb (fa/n)–Δf output from the sampling signal generation circuit 6 is created with a phase locked loop (PLL) circuit comprising a fixed dividing rate of frequency divider 2 for dividing the signal under test "a", the phase comparator 3 and the voltage control oscillator (VCO) 4.

In this manner, the sampling signal b is an equivalent to that is created by processing the signal under test "a" which is an object of measurement with the result that such sampling signal b is constantly phase synchronized with the signal under test "a".

Consequently, the jitter generation amount in the timing of sampling to the signal waveform d of the signal under test "a" is suppressed, so that the measurement precision of the signal waveform d of the signal under test "a" is improved.

However, the repetition frequency fb of the sampling signal b is represented in a function of a repletion frequency fa of the signal under test "a" as apparent from the above equations (1) and (2).

This fact means that the repetition frequency fb of the sampling signal b cannot be arbitrarily set independently of the repetition frequency fa of the signal under test "a" when using the fixed dividing rate of frequency divider and the fixed multiplying rate of frequency multiplier.

That is, in the conventional waveform measuring apparatus, as shown in FIG. 7, when the repetition frequency fa of the signal under test "a" changes, the time resolution of the signal waveform d of the signal under test "a", namely the measurement precision automatically changes.

So that the signal waveform d of the signal under test "a" cannot be measured in an arbitrary time resolution.

Furthermore, since the sampling signal b is directly created from the signal under test "a", there is a problem in that a complicated circuit structure is required which comprises the frequency divider 2, the phase comparator 3, the voltage control oscillator (VCO) 4, the frequency divider 5a and the multiplier 5b.

BRIEF SUMMARY OF THE INVENTION

In view of the above situation, an object of the present invention is to provide a waveform measuring apparatus which is capable of improving a measurement precision of a signal waveform of a signal under test and is capable of measuring the signal waveform in an arbitrary resolution precision because a frequency of a sampling signal for sampling the signal under test can be arbitrarily set independently of a repetition frequency of the signal under test by measuring the repetition and creating the sampling signal by using a common reference signal.

The present invention can be applied to the waveform measuring apparatus for sampling the signal under test which has an arbitrary repetition cycle which is input with a sampling signal having a cycle longer than the repetition cycle of the signal under test to determine an envelope waveform of the signal under test which is sampled, the apparatus determining the signal waveform of the signal under test from this envelope waveform.

In order to attain the above object, there is provided a waveform measuring apparatus (1) having sampling signal generation means (16) for generating a sampling signal having a cycle longer than a repetition cycle of a signal under test, a sampling portion (12) for sampling the signal under test in synchronization with the sampling signal from the sampling signal generation means and data processing portion (23) for determining an envelope waveform of a signal under test which is sampled with the sampling portion, and determining a signal waveform of the signal under test from this envelope waveform; the apparatus comprising:

reference signal generation means (14) for generating a reference signal independently of a repetition cycle of the signal under test;

frequency measuring means (15) for measuring a repetition frequency of the signal under test by using a reference signal from the reference signal generation means; and sampling frequency setting means (20) for computing and setting a value of a frequency of the sampling signal which can obtain a desired delay time with respect to a phase of the signal under test based on a value of a repetition frequency measured with the frequency measuring means;

wherein the sampling signal generation means uses the reference signal from the reference signal generation means and the value of the frequency set by the sampling frequency setting means to generate a sampling signal having a cycle corresponding to the frequency.

In the waveform measuring apparatus which is constituted in this manner, the reference signal generation means (14) generates a reference signal independently of the repetition cycle of the signal under test.

The frequency measuring means (15) measures the repetition frequency of the signal under test by using a reference signal from the reference signal generation means.

The sampling signal frequency setting means (20) sets a frequency of a sampling signal which can obtain a desired delay time with respect to a phase of the signal under test by using a repetition frequency measured with the frequency measuring means.

Consequently, the repetition frequency (repetition cycle) of the signal under test is accurately measured with the frequency measuring means.

Then, the sampling frequency setting means sets a frequency of the sampling signal which can obtain a desired delay time with respect to the phase of the signal under test by using the repetition frequency measured with the frequency measuring means.

Then, the sampling signal generation means creates a sampling signal having a cycle of the frequency which is set so that a desired delay time can be obtained with respect to the phase of the signal under test.

In this case, since it is possible to set the frequency of the sampling signal in an arbitrary relation with respect to the repetition frequency of the signal under test so that the signal waveform of the signal under test can be measured in an arbitrary resolution.

Furthermore, the repetition frequency of the signal under test is measured and the sampling signal is created by using a common signal.

Consequently, with respect to the sampling signal, the set state of the frequency set in advance with respect to the signal under test can be accurately measured so that the precision in the measurement of the waveform can be improved.

Furthermore, in order to attain the above object, according to the present invention, there is provided a waveform measuring apparatus (2) according to (1), wherein the reference signal generation means includes a rubidium atomic oscillator.

Furthermore, in order to attain the above object, according to the present invention, there is provided a waveform measuring apparatus (3) according to (1), wherein the reference signal generation means includes a cesium oscillator.

In order to attain the above object, according to the present invention, there is provided a waveform measuring apparatus (4) according to (1), further comprising:

a power divider for dividing the signal under test which is an optical signal into two directions when the signal under test is the optical signal; and a photo detector for converting a signal under test which is one optical signal which is divided with the power divider into a signal under test of an electric signal;

wherein the repetition frequency of the signal under test which is converted into an electric signal by the photo detector is measured with the frequency measuring means, the measured value of the repetition frequency of the signal under test measured with the frequency means is given to the sampling frequency setting means.

Furthermore, in order to attain the above object, there is provided a waveform measuring apparatus (5) according to (1), further comprising:

a power divider for dividing the signal under test which is an optical signal into two directions when the signal under test is the optical signal; and a clock recovery for converting a signal under test which is an optical signal into a signal under test of an electric signal having a repetition frequency and outputting the signal by detecting a clock of the repetition cycle from one signal under test divided with the power divider;

wherein the repetition frequency of the signal under test which is converted into an electric signal with the clock recovery is measured with the frequency measuring means, and the measured value of the repetition frequency of the signal under test measured with the frequency measuring means is given to the sampling frequency setting means.

Furthermore, in order to attain the above object, according to the present invention, there is provided a waveform measuring apparatus (6) according to (1) further comprising:

a photo detector (21) for receiving a signal under test of an optical signal sampled with a sampling signal input from the sampling signal generation circuit with the electro-absorption modulator and converting the signal under test which is an optical signal after being sampled into a signal under test which is an electric signal when the signal under test is an optical signal and the sampling portion is an electro-absorption modulator;

an analog/digital converter (22) for converting the signal under test which is converted into an electric signal with the photo detector into a signal under test to send the converted signal to the data processing portion; and a display device (24) converting a magnification of a time axis in the envelope waveform determined with the data processing portion into a magnification of the original signal under test to display the magnification as a signal waveform of the signal under test.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 6A, 6B and 6C are views for explaining a principle for determining the signal waveform of a conventional representative signal under test with a sampling method; and FIG. 7 is a block diagram showing a general structure of a conventional waveform measuring apparatus.

DETAILED DESCRIPTION OF THE INVENTION

Figure 1:
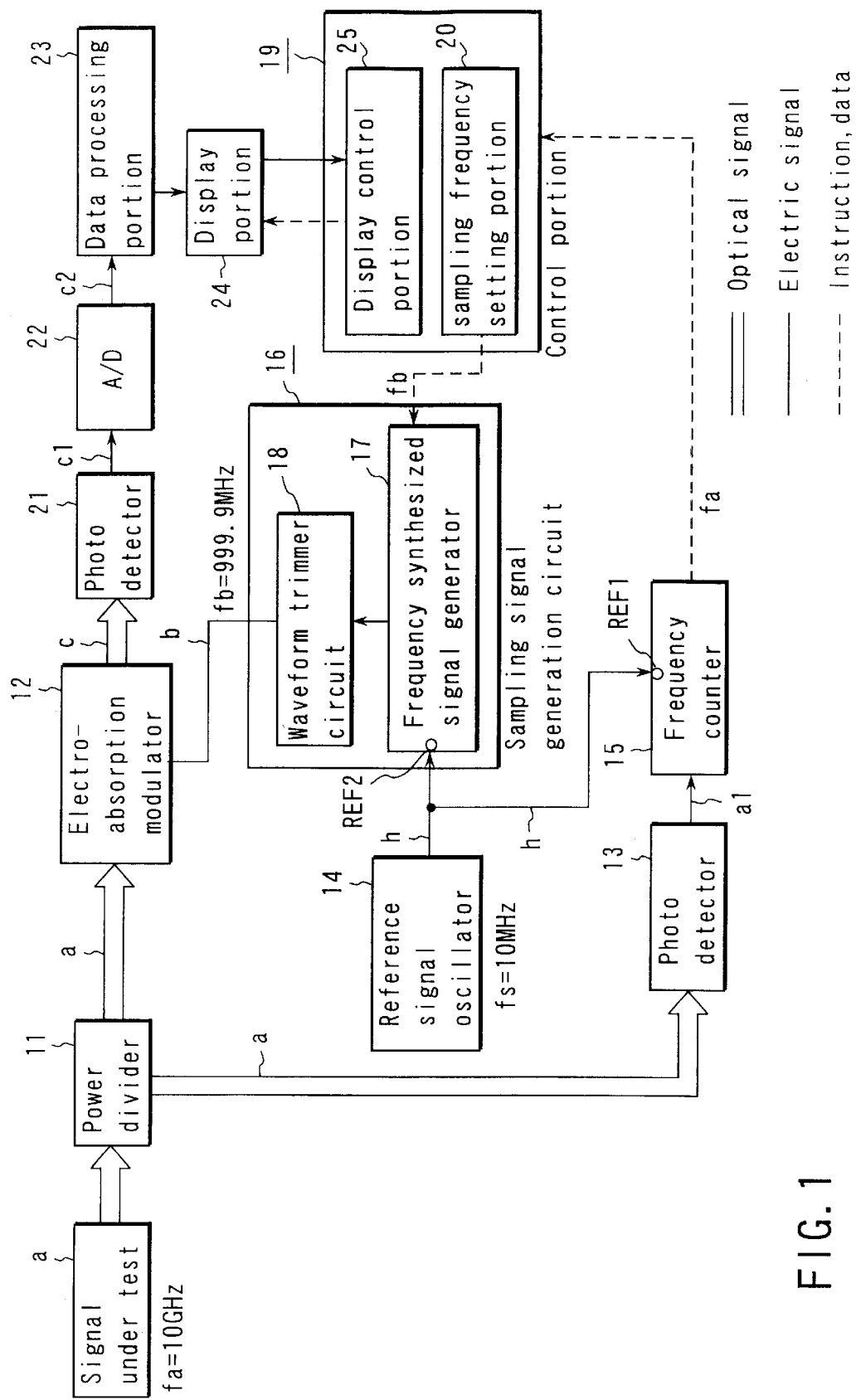
FIG. 1 is a block diagram showing a general structure of a waveform measuring apparatus according to a first embodiment of the present invention.

Reference will now be made in detail to the presently preferred embodiments of the invention as illustrated in the accompanying drawings, in which like reference numerals designate like or corresponding parts.

Hereinafter, each of the embodiments of the present invention will be explained by using the drawings of each of the embodiments.

(First Embodiment)

FIG. 1 is a block diagram showing a general structure of a waveform measuring apparatus according to a first embodiment of the present invention.

In the beginning, for example, the signal under test "a" which comprises an optical signal having a repetition cycle Ta (repetition frequency fa) input from the input terminal (not shown) is divided off into two directions with the power divider 11. One of the signals is incident on an electro-absorption modulator 12 as a sampling circuit while the other signal is incident on the photo detector 13.

Incidentally, it is assumed that in the waveform measuring apparatus according to the present invention, the repetition frequency fa of the signal under test "a" is set to 10 GHz.

The reference signal oscillator 14 oscillates, for example, a reference signal h having a reference frequency fs (=10 MHz) of 10 MHz, so that this reference signal "h" is applied to the input terminal (REF1) of the reference signal of the frequency counter 15 and the reference signal input terminal (REF2) of the frequency synthesized signal generator 17 in the sampling signal generation circuit 16.

In this case, as the reference signal oscillator 14 which serves as a reference signal oscillating means, a highly stable oscillator such as a rubidium atomic oscillator having a stability of oscillation frequency on the order of $3 \times 10^{-12}$/sec and a cesium atomic oscillator having a stability on the order of $8 \times 10^{-12}$/sec or the like is used.

Then, the photo detector 13 converts the signal under test "a" of the incident optical signal into a signal under test "a" of the electric signal to send the signal to the frequency counter 15 as a frequency measuring means.

The frequency counter 15 uses the reference signal "h" applied to the reference signal input terminal (REF1) to measure the repetition cycle fa of the signal under test al of the input electric signal.

Specifically, this frequency counter 15 counts the frequency of the reference signal "h" to create the base measurement period and count the number of clocks (number of waves) of the signal under test input to this reference signal measurement period.

Then, the frequency counter 15 sends the repetition frequency fa of the signal under test to the sampling frequency setting portion 20.

The sampling frequency setting portion 20 in this control portion 19 calculates the repetition frequency fb of the sampling signal b output from the sampling signal generation circuit 16 by using the above equation (1) from the repetition frequency fa of the input signal under test "a" input from the frequency counter 15.

For example, in the case where the measured value under the condition of n=10, and Δf=0.1 Mz is fa=10 GHz, the repetition frequency of the sampling signal b is set to fb=999.9 MHz from fb=(fa/n)−Δf.

Next, the sampling frequency setting portion 20 sets the calculated repetition frequency fb to the frequency synthesized signal generator 17 in the sampling signal generation circuit 16.

Here, the frequency synthesized signal generator 17 in the sampling frequency generation circuit 16 comprises, for example, frequency synthesizers. It is possible to create a signal having an arbitrary frequency by multiplying or dividing a reference signal "h" having a reference frequency of fs=10 MHz which is applied to the reference signal input terminal (REF2).

Specifically, this frequency synthesized signal generator 17 creates a sine waveform signal having a frequency fb of the repetition frequency designated in the equation (1) from the sampling frequency setting portion in the control portion 19.

Then, the signal of the sine waveform having a frequency fb output from the frequency synthesized signal generator 17 is trimmed in the waveform into the sampling signal b with a pulse waveform configuration having a repetition frequency fb (repetition cycle Tb) as shown in FIG. 6B in the following waveform trimmer circuit 18.

In this manner, the sampling signal b having a repetition frequency fb output from the sampling signal generation circuit 16 is input to the electro-absorption modulator 12.

This electro-absorption modulator 12 samples the sampling signal b obtained by inputting the signal under test "a" of the incident optical signal from the sampling signal generation circuit 16 to emit the sampled optical signal to the photo detector 21.

This photo detector 21 converts the signal under test c of the optical signal after incident sampling into the signal under test c1 of the electric signal.

Then, the signal under test c1 output from the photo detector 21 is A/D converted into a signal under test c2 which is digitally sampled with the digital/analog (A/D) converter 22 to be input to the data processing portion 23.

Figure 2:
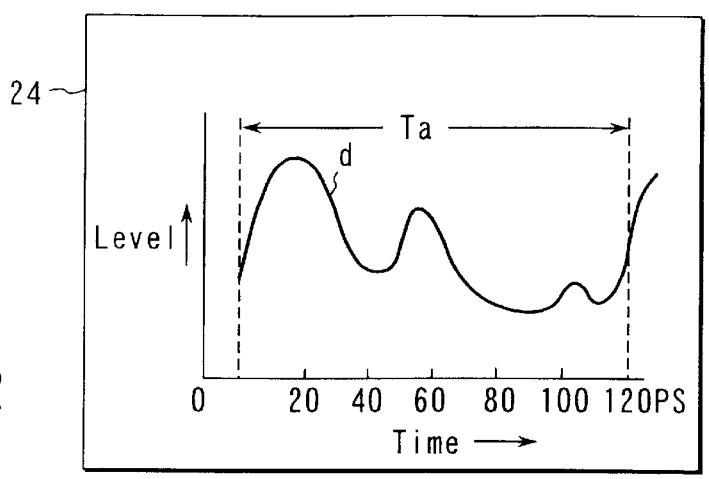
FIG. 2 is a view showing a signal waveform of a signal under test measured with the waveform measuring apparatus according to the first embodiment of the present invention.

This data processing portion 23 calculates the envelope waveform of the signal under test c2 which is input and sampled. As shown in FIG. 2, the magnification of the time axis of this envelope waveform is converted into the magnification of the original signal under test "a" to be output and displayed on the display portion 24 as a signal waveform d of the signal under test "a".

At this time, the display control portion 25 in the control portion 19 has a function of monitoring the signal waveform d of the signal under test "a" which is displayed on the display portion 24 and automatically correcting the display position of the signal waveform d to a normal position.

Specifically, the display control portion 25 in the control portion 19 is such that the signal waveform d of the signal under test "a" which is displayed on the display portion 24 is drifted on the display screen resulting from the fact that the repetition frequency fa of the input signal under test "a" and the repetition frequency fb of the sine signal created at the frequency synthesized signal generator 17 do not accurately satisfy the equation (1).

Then, the display control portion 25 of the control portion 19 monitors the signal waveform d of the signal under test "a" displayed on the display portion 24 and adjusts the scanning (sweep) start position on the display screen of the signal waveform d so that this drift is not ostensibly generated.

In the waveform measuring apparatus according to the first embodiment which is constituted in this manner, the repetition frequency fa (repetition cycle Ta) of the input signal under test "a" is measured with the frequency counter 15.

Then, the sampling frequency setting portion 20 in the control portion 19 calculates the frequency fb of the sampling signal b by using this measured repetition frequency fa in the above equation (1) to set the frequency fb to the frequency synthesized signal generator 17 in the sampling signal generation circuit 16.

In this case, it is possible to maintain the frequency fb of the sampling signal b in an arbitrary relation with respect to the repetition frequency fa of the signal under test "a" by appropriately adjusting the values of n and Δf.

In other words, the frequency fb of the sampling signal b can be set to an arbitrary value independently of the repetition frequency fa of the signal under test "a".

Furthermore, the reference signal "h" from the reference signal oscillator 14 is applied to the frequency counter 15 and the frequency synthesized signal generator 17 in the sampling signal generation circuit 16.

Consequently, the repetition frequency fa of the signal under test "a" is measured and the sampling signal b is created by using a common reference signal "h".

Consequently, since the set state of the frequency between the frequency fb of the sampling signal b which is set in advance and the repetition frequency fa is accurately maintained, the precision in the measurement of the waveform can be improved.

Figure 3:
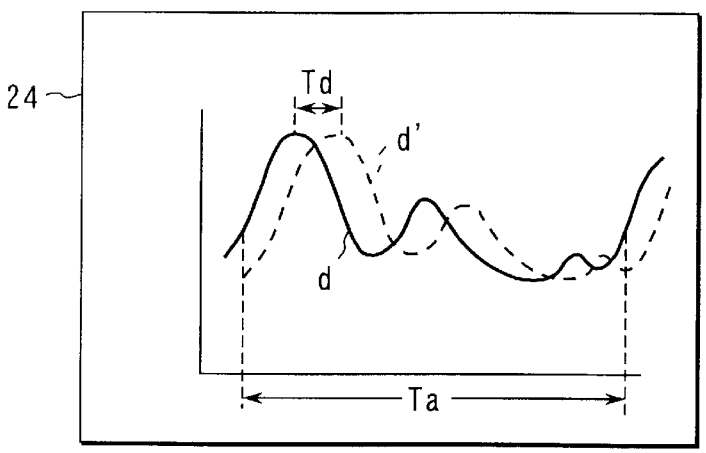
FIG. 3 is a view showing a signal waveform of a signal under test measured with the waveform device according to the first embodiment of the present invention.

Furthermore, as described above, in the state in which the set state of the frequency between the frequency fb of the sampling signal b and the repetition frequency fa of the signal under test "a" is accurately maintained, the signal waveform d' shown in a solid line displayed in the display portion 24 moves as in a signal waveform d' shown in a dot line when the phase of the signal under test "a" changes, as shown in FIG. 3.

Consequently, the phase change amount φ in the signal under test "a" can be grasped by measuring this movement quantity Td.

Furthermore, as described above, when the relationship between the frequency fb of the sampling signal b and the repetition frequency fa of the signal under test "a" does not satisfy the equation (1), the signal waveform d displayed in the display portion 24 continues to be drifted.

From the measurement start time, for example, only in the initial measurement period of 5 through 10 sec, the frequency counter 15 is driven to determine the frequency fb of an accurate sampling signal b by using the equation (1) at the sampling frequency setting portion 20 to be set at the sampling signal generation circuit 16.

After the lapse of the initial measurement period, the measurement in the frequency counter 15 and the sampling frequency setting portion 20, and the calculation operation are suspended, and the frequency fb of the sampling signal b is fixed to the value determined at the initial measurement period.

Furthermore, the display adjustment operation of the display control portion 25 described above is suspended.

In such a state, when the repetition frequency fa of the signal under test "a" is frequency drifted from the initial period measurement period, the signal waveform d displayed on the display portion 24 continues to be drifted in correspondence to this frequency drift.

Consequently, it is possible to grasp the frequency change amount in a signal under test "a" by measuring the drift amount per unit time of the signal waveform d displayed on the display portion 24.

(Second Embodiment)

Figure 4:
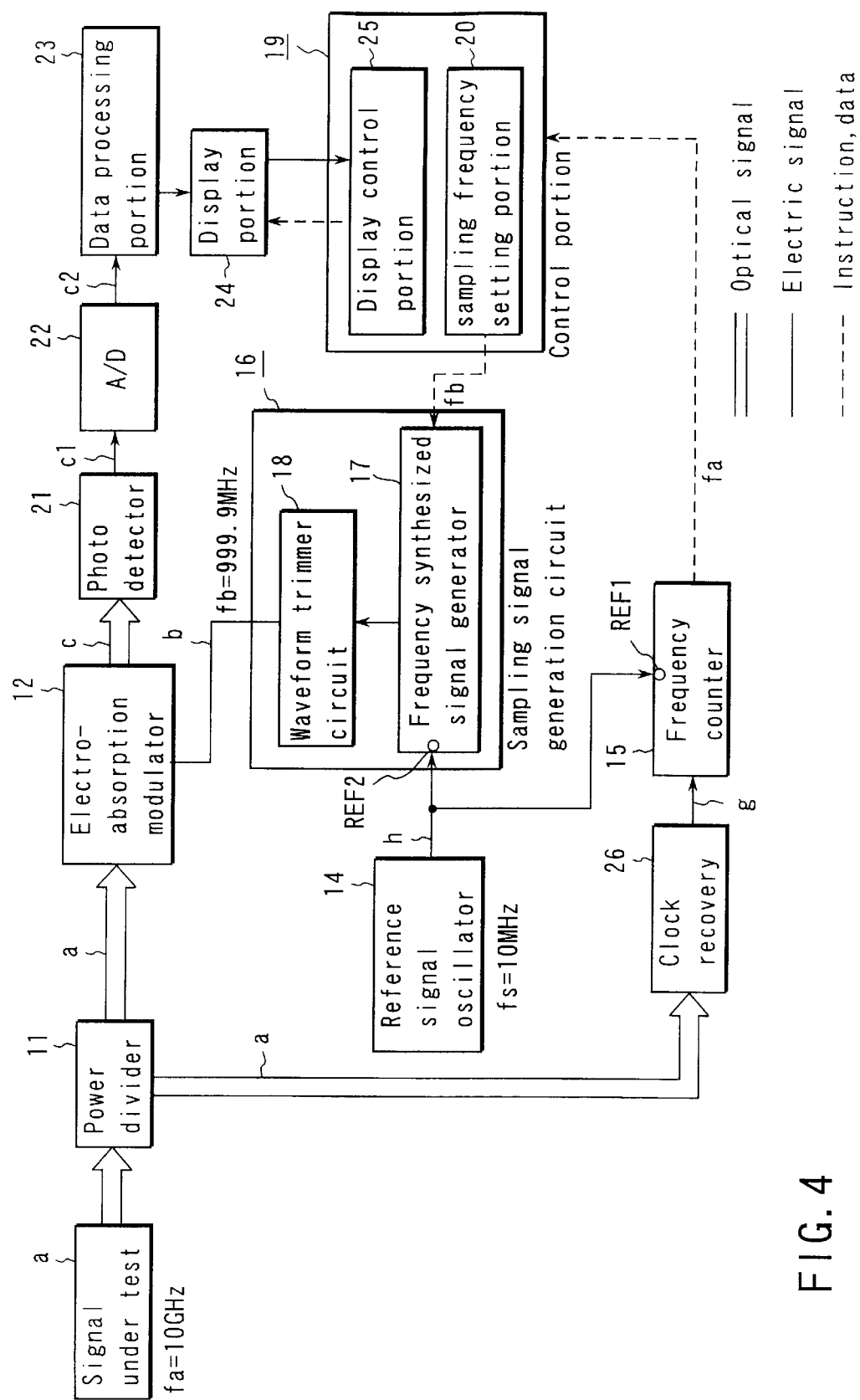
FIG. 4 is a block diagram showing a general structure of a waveform measuring apparatus according to a second embodiment of the present invention.

FIG. 4 is a block view showing a general structure of a waveform measuring apparatus according to a second embodiment of the present invention.

In FIG. 4, like portions as the waveform measuring apparatus according to the first embodiment shown in FIG. 1 are denoted by like reference numerals and a detailed explanation on the overlapped portions is omitted.

In the waveform measuring apparatus according to the second embodiment, the signal under test "a" having a repetition frequency fa input from the outside is incident on the electro-absorption modulator 12 as it is while the signal is divided with the power divider 11 to be incident on the clock recovery 26.

Figure 5A:
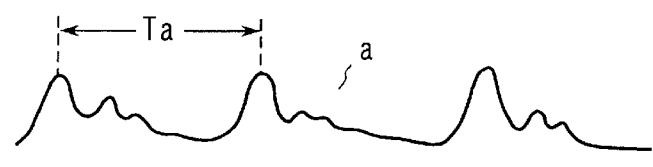
FIGS. 5A, 5B, 5C and 5D are waveform diagrams showing a signal under test and a recovery clock signal for explaining an effect of a clock recovery device incorporated in a waveform measuring apparatus according to a third embodiment of the present invention.
Figure 5B:
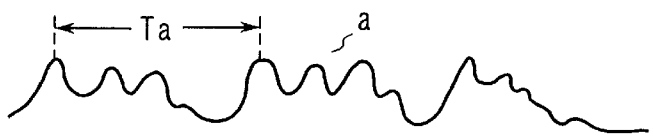
Figure 5C:
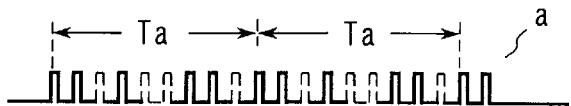
Figure 5D:

Conventionally, as well known, the clock recovery 26 detects the start timing of the repetition cycle Ta, namely, the clock of the repetition cycle Ta (frequency fa) to convert the signal under test "a" that is an incident optical signal into a recovery clock signal g as shown in FIG. 5D which is an electric signal having a frequency fa (repetition frequency) and send the signal to the next frequency counter 15.

This frequency counter 15 measures the frequency (repetition frequency fa) of the recovery clock signal g of the input electric signal to send the data of the measured repetition frequency fa to the sampling frequency setting portion 20 of the control portion 19.

The following operation is the same as the operation of the waveform measuring apparatus according to the first embodiment shown in FIG. 1.

In the waveform measuring apparatus according to the second embodiment which is constituted in this manner, the repetition frequency fa of the signal under test "a" can be measured at the frequency counter 15. Consequently, like the waveform measuring apparatus according to the first embodiment, the signal waveform d of the signal under test "a" can be measured in an arbitrary resolution.

Furthermore, in the waveform measuring apparatus according to the second embodiment, the clock of the repetition frequency Ta (frequency fa) is detected by using the clock recovery 26 to send the recovery clock signal g to the frequency counter 28.

That is, as shown in each of the waveforms shown in FIGS. 5B and 5C, the waveform of the signal under test "a" has various configurations. Like the waveform shown in FIG. 5A, it does not always happen that a clear one peak waveform is present for each of the repetition cycle Ta (frequency fa).

Consequently, even when the signal under test "a" having a such a waveform is counted with the frequency counter 26 to directly count the repetition frequency fa (repetition cycle Ta), there is a problem that many peak waveforms and few peak waveforms are counted so that an erroneous repetition frequency fa is output.

Then, the clock of the signal under test "a" is reproduced by using the clock recovery 26 to obtain a recovery clock signal g as shown in FIG. 5D with the result that the repetition frequency fa (repetition cycle Ta) of the signal under test "a" can be detected at a high precision even when the signal under test "a" has a complicated configuration as shown in FIGS. 5B and 5C.

Incidentally, the present invention is not limited to the structure of the device according to the first and the second embodiment.

For example, in each of the waveform measuring apparatus, the repetition frequency fa of the signal under test "a" measured with the frequency counter 15 is automatically set to the sampling frequency setting portion 20.

However, the measured value (repetition frequency fa) of the frequency counter 15 may be read with the eye and may be automatically set in the sampling frequency setting portion 20 of the control portion 19 in a manual operation by the operator.

Further, in each of the embodiments, the signal under test "a" is assumed to be an optical signal.

However, the signal under test "a" may be a normal electric signal.

In this case, instead of the electro-absorption modulator 12, a sampling circuit 1 which is used in the normal electric signal shown in FIG. 7 is adopted and the photo detector 13 and 21 are removed.

As has been explained above, in the waveform measuring device according to the present invention, the repetition frequency of the signal under test is measured and the sampling signal is created by using a common reference signal.

Thus, in the waveform measuring apparatus according to the present invention, the frequency of the sampling signal for sampling the signal under test can be arbitrarily set independently of the repetition frequency of the signal under test while the set state of the signal under test with respect to the repetition frequency of the signal under test can be accurately maintained. Consequently, the measurement precision of the signal waveform of the signal under test can be improved while the signal waveform can be measured in an arbitrary resolution precision.

Consequently, according to the present invention, the frequency of the sampling signal for sampling the signal under test can be arbitrarily set independently of the repetition frequency of the signal under test by measuring the repetition frequency of the signal under test and creating a sampling signal while the set state with respect to the repetition frequency of the signal under test can be accurately maintained. Consequently, it becomes possible to provide a waveform measuring device which is capable of improving the measurement precision of the signal waveform of the signal under test and measuring the signal waveform at an arbitrary resolution precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A waveform measuring apparatus having sampling signal generation means for generating a sampling signal having a cycle longer than the repetition cycle of a signal under test, a sampling portion for sampling the signal under test in synchronization with the sampling signal from the sampling signal from the sampling signal generation means and data processing portion for determining an envelope waveform of a signal under test which is sampled with the sampling portion, and determining a signal waveform of the signal under test from this envelope waveform; the apparatus comprising:

reference signal generation means for generating a reference signal independently of a repetition cycle of the signal under test;

frequency measuring means for measuring a repetition frequency of the signal under test by using a reference signal from the reference signal generation means; and sampling frequency setting means for computing and setting a value of a frequency of a sampling signal which can obtain a desired delay time with respect to a phase of the signal under test based on a value of a repetition cycle measured with the frequency measuring means;

wherein the sampling frequency generation means uses a reference signal from the reference signal generation means and the value of the frequency set by the sampling frequency setting means to generate a sampling signal having a cycle corresponding to the frequency.

2. A waveform measuring apparatus according to claim 1, wherein the reference signal generation means includes a rubidium atomic oscillator.

3. A waveform measuring apparatus according to claim 1, wherein the reference signal generation means include a cesium atomic oscillator.

4. A waveform measuring apparatus according to claim 1, further comprising:

a power divider for dividing a signal under test which is optical signal into two directions when the signal under test is an optical signal; and a photo detector for converting a signal under test which is one optical signal which is divided with the power divider into a signal under test which is an electric signal;

wherein a repetition frequency of the signal under test which is converted into an electric signal with the photo detector is measured with the frequency measuring means; and the measured value of the repletion frequency of the signal under test measured with the frequency measuring means is given to the sampling frequency setting means.

5. A waveform measuring apparatus according to claim 1, further comprising:

a power divider for dividing the signal under test which is an optical signal into two directions when the signal under test is the optical signal; and a clock recovery for converting a signal under test which is an optical signal into a signal under test of an electric signal having a repetition frequency and outputting the converted signal by detecting a clock of the recovery cycle from one signal under test divided with the power divider;

wherein the repetition frequency of the signal under test which is converted into an electric signal with the clock recovery is measured with the frequency measuring means, and the measured value of the repetition frequency of the signal under test measured with the frequency measuring means is given to the sampling frequency setting means.

6. A waveform measuring apparatus according to claim 1, further comprising:

a photo detector for receiving a signal under test of an optical signal sampled with a sampling signal input from the sampling signal generation circuit with the electro-absorption modulator and converting the signal under test which is an optical signal after being sampled into a signal under test which is an electric signal when the signal under test is an optical signal and the sampling portion is an electro-absorption modulator;

an analog/digital converter for converting a signal under test which is converted into an electric signal with the photo detector into a digital signal under test to send the digital signal under test to the data processing portion; and a display device for converting a magnification of a time axis in the envelope waveform determined with the data processing portion into a magnification of the original signal under test to display the magnification as a signal waveform of the signal under test.

* * * * *